United States Patent
Knecht

(10) Patent No.: US 7,005,859 B2
(45) Date of Patent: Feb. 28, 2006

(54) CIRCUIT ARRANGEMENT AND METHOD FOR MONITORING A CURRENT CIRCUIT

(75) Inventor: Gerhard Knecht, Iffezheim (DE)

(73) Assignee: Robert Bosch GmbH, Stuttgart (DE)

( * ) Notice: Subject to any disclaimer, the term of this patent is extended or adjusted under 35 U.S.C. 154(b) by 148 days.

(21) Appl. No.: 10/478,148

(22) PCT Filed: Jan. 24, 2003

(86) PCT No.: PCT/DE03/00188

§ 371 (c)(1),
(2), (4) Date: Nov. 19, 2003

(87) PCT Pub. No.: WO03/081263

PCT Pub. Date: Oct. 2, 2003

(65) Prior Publication Data

US 2004/0145373 A1 Jul. 29, 2004

(30) Foreign Application Priority Data

Mar. 22, 2002 (DE) .............................. 102 12 685

(51) Int. Cl.
*G01R 31/08* (2006.01)
*G01R 27/08* (2006.01)
(52) U.S. Cl. ...................... 324/522; 324/714
(58) Field of Classification Search ............ 324/522, 324/713, 714; 388/800–824, 903, 909; 318/778–811
See application file for complete search history.

(56) References Cited

U.S. PATENT DOCUMENTS

| 3,934,239 | A | | 1/1976 | Mason et al. |
| 4,706,674 | A | * | 11/1987 | Dieken et al. ................ 607/46 |
| 5,251,091 | A | * | 10/1993 | Ito et al. ..................... 361/152 |
| 5,357,181 | A | * | 10/1994 | Mutoh et al. ............... 318/139 |
| 5,587,865 | A | * | 12/1996 | Bielig et al. ................. 361/45 |
| 5,739,649 | A | * | 4/1998 | Akao ......................... 318/139 |

FOREIGN PATENT DOCUMENTS

| GB | 2 360 335 A | 9/2001 |
| JP | 2000-329799 | 11/2000 |

\* cited by examiner

*Primary Examiner*—Vincent Q. Nguyen
*Assistant Examiner*—Timothy J. Dole
(74) *Attorney, Agent, or Firm*—Ronald E. Greigg

(57) ABSTRACT

A circuit arrangement and a method are described with which a current circuit can be monitored for correct function. A first and a second current sensor are provided in the current circuit. In a test phase, the second current sensor is switched to the current circuit. Next, a current flow is brought about through the first and the second current sensors, and the current intensity is measured via the first and second current sensors. From a comparison, an error function of the current sensor can be detected. The circuit arrangement according to the invention and the method according to the invention are particularly suitable for use in safety-oriented equipment.

8 Claims, 2 Drawing Sheets

CIRCUIT ARRANGEMENT AND METHOD FOR MONITORING A CURRENT CIRCUIT

CROSS-REFERENCE TO RELATED APPLICATIONS

This application is a 35 USC 371 application of PCT/DE 03/00188 filed on Jan. 24, 2003.

BACKGROUND OF THE INVENTION

1. Field of the Invention

The invention relates to a circuit arrangement with a current circuit and to a method for monitoring a current circuit.

2. Description of the Prior Art

Current circuits are used in the most various areas of technology for supplying consumers. In supplying a consumer, in particular a consumer in a motor vehicle, in which the consumer performs safety-oriented functions, monitoring the current supply is an essential aspect of safety. The current supply is necessary if the safety-oriented consumer is to be capable of functioning correctly, and this current supply must therefore be monitored with regard to a failure or an error mode.

It is already known in such safety-critical systems as an electromechanical brake in a motor vehicle to provide a current sensor in the current circuit and to detect the current flowing in the current circuit via the current sensor, compare it with a comparison value, and depending on the outcome of comparison, to detect an error function or correct function of the current circuit. For instance, if an electronically commutated motor is driven via the current circuit, then via the current sensor the phase current is measured, and the torque that the motor is to output is adjusted with the aid of a phase current regulator. At the same time, the capability of correct function is monitored via the current measurement by the current sensor.

OBJECTS AND SUMMARY OF THE INVENTION

The object of the invention is to furnish a circuit arrangement and a method for supplying a consumer that enable reliable monitoring of the function of the current supply.

One essential advantage of the circuit arrangement of the invention is that a second current sensor is provided in the current circuit, and that via the second current sensor, the current flow in the current circuit can be detected redundantly. It is thus possible on the basis of the second current sensor to monitor correct functioning of the first current sensor. For instance, if in the embodiments of the prior art the first current sensor produces a faulty signal, this is not detected, at least immediately, as an error signal. In contrast, the invention offers the advantage of monitoring the current circuit independently of the first current sensor. This provides double safety for correct monitoring of the current circuit.

Preferably, the second current sensor can be switched into the current circuit, so that the second current sensor electrically affects the current circuit only when the current circuit is being monitored. Reliable monitoring is thus furnished without adversely affecting the electrical properties of the current circuit.

In a simple embodiment, a switch is provided by way of which the second current sensor can be coupled to the current circuit. Preferably, a further switch is provided, with which the consumer can be decoupled from the current circuit. In this way, it is assured that monitoring of the current circuit is possible without the consumer having any electrical influence on the current circuit.

Preferably, the second current sensor is embodied in the form of a resistor. A voltage drop across the resistor can be detected as a measurement variable, for assessing the current flow in the current circuit. Using a resistor as a current sensor is economical and makes a reliable method possible.

Preferably, an electric drive mechanism, especially a winding of the electric drive mechanism, is monitored with the circuit arrangement of the invention. The circuit arrangement of the invention is especially well suited to monitoring a safety-oriented consumer in a motor vehicle, such as an electromechanical brake.

In a preferred application, the second current sensor is placed between two high-side switches and the corresponding supply lines to windings of an electronically commutated motor. In this embodiment, a switch for turning the current sensor on or off can be omitted. By means of the connection selected, the current sensor has no perceptible effects on the operation of the motor. An economical embodiment of the circuit arrangement of the invention is thus possible, since the current sensor, particularly in the form of a resistor, can also be integrated as part of an integrated circuit.

Preferably, in monitoring the current flow, the second current sensor is connected in series with a winding of an electronically commutated motor. Thus besides monitoring the current flow, it is also possible to monitor the function of the winding of the motor.

BRIEF DESCRIPTION OF THE DRAWINGS

The invention will be described in further detail below in conjunction with the drawings, in which.

DESCRIPTION OF THE PREFERRED EMBODIMENTS

The fundamental principle of the invention can be employed in the most various fields of technology. For instance, safety-oriented circuits can be used in the fields of civil engineering, aeronautics, control technology, nuclear power plants, or automotive engineering. The circuit arrangement and the method of the invention, regardless of the field in which they are employed, offer enhanced safety in monitoring a current circuit. The invention will be described in further detail below taking as an example an electromechanical brake for a motor vehicle.

The invention will be described in further detail below taking as an example an electromechanical brake for a motor vehicle.

Figure 1:
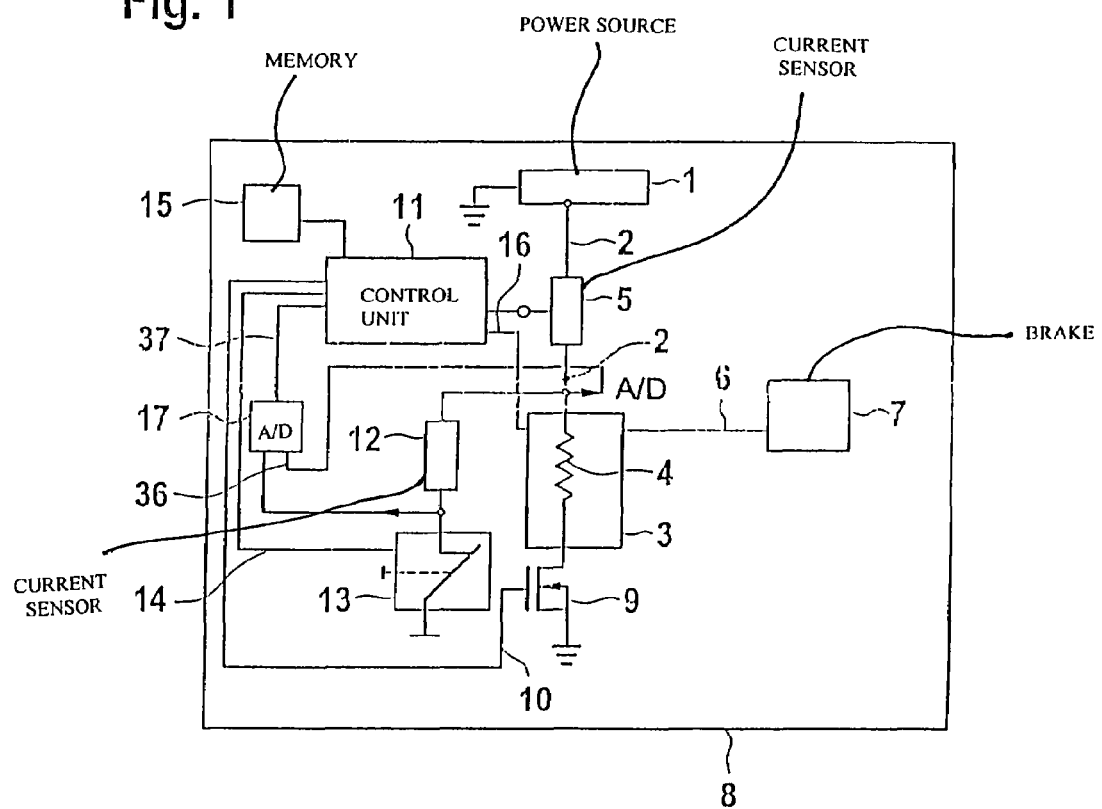
FIG. 1, a schematic illustration of the circuit arrangement of the invention.

FIG. 1, in a simplified illustration, shows the fundamental principle of the circuit arrangement of the invention. A direct-voltage source 1 is provided, which furnishes a fixed direct voltage. The direct-voltage source is in communication, via a current line 2 and a current sensor 5, with an electric drive mechanism 3. The electric drive mechanism 3 is for instance an electronically commutated motor, which has windings 4. An electronically commutated motor is well known and is described for instance in *"Handbuch der*

*elektrischen Anlagen und Maschinen*" [Manual of Electrical Systems and Machines] by Egbert Hering, published by Springer-Verlag, 1999, ISBN 3-540-65184-5, chapter A8.5.1.3, pages 203 ff. The drive 3 is operatively connected via a drive rod 6 with final control elements of an electromechanical brake 7. Via the drive rod 6, the drive 3 controls the mode of operation of the electromechanical brake 7. The drive 3 can be connected to a ground potential via a first switch 9, which is preferably embodied as a field effect transistor. The first switch 9 is in communication with a control unit 11 via a control line 10.

Between the current sensor 5 and the drive 3, a second current sensor 12 is connected to the current line 2. The second current sensor 12, in a simple embodiment, can be embodied as a defined resistor. One output of the second current sensor 12 can be connected to ground via a second switch 13. The second switch 13 is in communication with the control unit 11 via a second control line 14. The control unit 11 is also connected to the current sensor 5. A memory 15 is also provided, in which control information and control fields are stored. The control unit 11 is furthermore connected to the drive 3 via a third control line 16.

In a known manner, the control unit 11 controls the phase currents for the windings 4 of the electrically commutated motor 3 in accordance with the desired rpm and the desired torque that the motor 3 is to furnish to the electromechanical brake 7. To that end, operating parameters of a motor vehicle 8 in which the circuit arrangement is disposed are taken into account. In addition, via the current sensor 5, the control unit 11 detects the current supplied to the drive 3 via the current line 2. The current is compared with reference values, and an error function of the current supply is detected if the detected current differs from the reference values by more than a predetermined differential value.

The input and output of the second current sensor 12 are connected to an A/D converter 17 via measurement lines 36. One output 37 of the A/D converter 17 is carried to the control unit 11.

For monitoring the current sensor 5 and the current supply of the drive 3, the control unit 11, in a monitoring phase, switches the resistor 12 to the current line 2; that is, the control unit 11 closes the second switch 13 and thus connects the output of the resistor 12 to ground. Preferably, the first switch 9 that is closed in normal operation is switched by the control unit 11 into an open position, so that current no longer flows via the drive 3 but solely through the second current sensor 12. In the monitoring phase, the control unit 11 detects the voltage both at the input and at the output of the resistor 12. From the voltage drop across the resistor 12, the control unit 11 detects the current flowing through the current sensor 5.

With the knowledge of the resistance of the resistor 12, the control unit 11 calculates the current that is supplied to the drive 3. The current ascertained via the second current sensor 12 is compared with the current ascertained by the current sensor 5. If the comparison shows that the current ascertained by the current sensor 5 differs from the current that was calculated via the voltage drop of the resistor 12, then the control unit 11 detects an error function of the current sensor 5 and outputs an error signal, for instance to a display system of the motor vehicle 8. In addition, the control unit 11 can switch over to an emergency function, to assure safe stopping of the motor vehicle 8.

The monitoring is preferably done cyclically, whenever the drive 3 is not needed to actuate the electromechanical brake 7.

Figure 2:
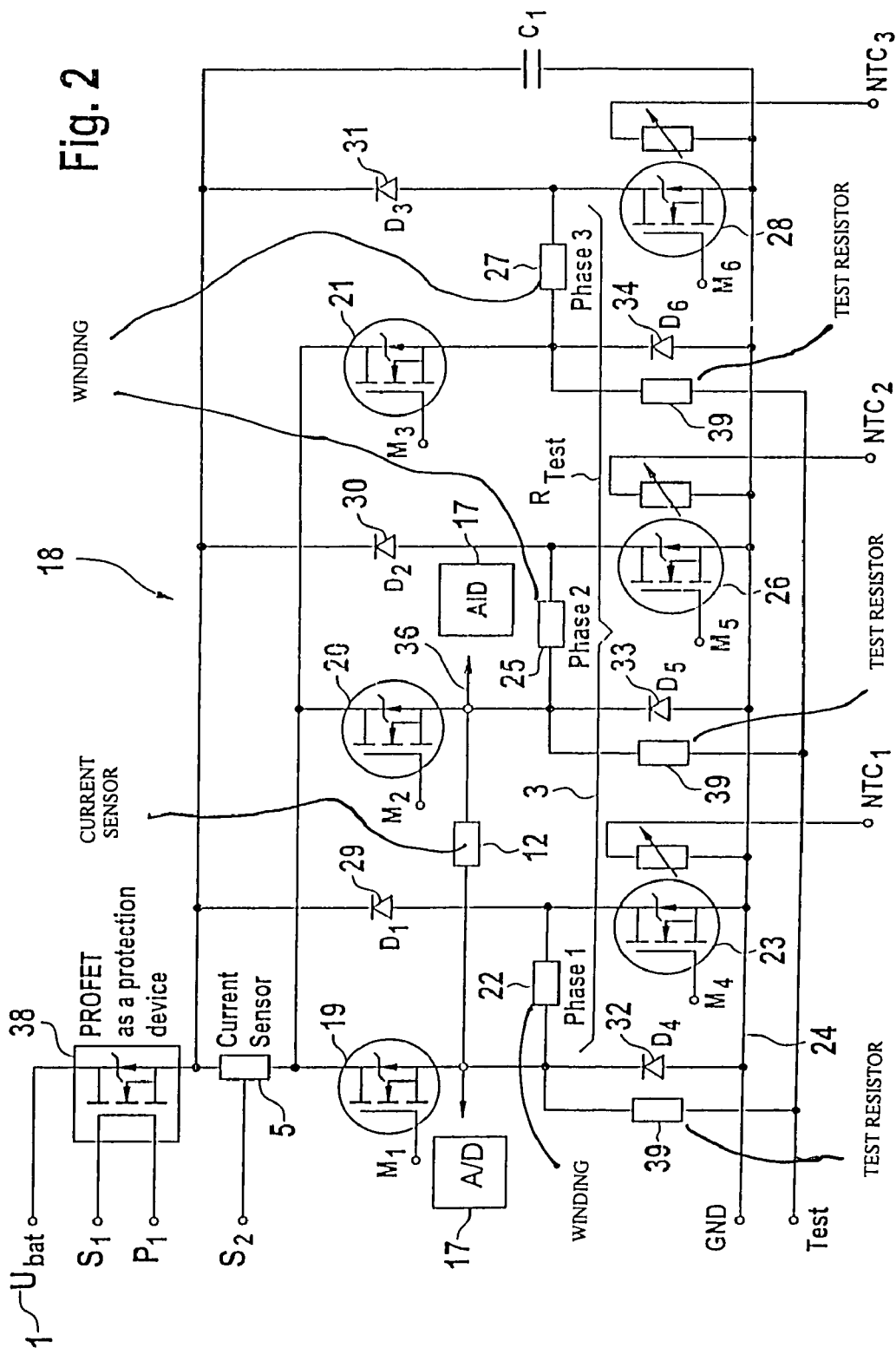
FIG. 2, a detail of a trigger unit for an electromechanical brake, in which the circuit arrangement of the invention is employed.

FIG. 2 shows a further advantageous embodiment of the circuit arrangement of the invention, which is preferably integrated with a trigger circuit for an electronically commutated motor 3. Advantageously, the second current sensor 12 is also integrated into the trigger circuit 18. An economical realization of the circuit arrangement can thus be achieved. The motor 3 is shown only schematically in the form of the three windings 22, 25, 27.

A direct-voltage source 1 is provided, which can be connected to one input of the current sensor 5 via a third switch 38. One output of the current sensor 5 is in communication with inputs of a first, second and third transistor 19, 20, 21. One output of the first transistor 19 is connected to one input of a first winding 22. One output of the first winding 22 is connected to one input of a fourth transistor 23. One output of the fourth transistor 23 is in communication with a ground line 24.

One output of the second transistor 20 is in communication with one input of a second winding 25. One output of the second winding 25 is in communication with one input of a fifth transistor 26. One output of the fifth transistor 26 is connected to the ground line 24. One output of the third transistor 21 is connected to one input of a third winding 27. One output of the third winding 27 is connected to one input of a sixth transistor 28. One output of the sixth transistor 28 is connected to the ground line 24. The outputs of the first, second and third windings 22, 25 and 27 are connected to the input of the current sensor 5 via a first, second and third diode 29, 30, and 31, respectively. The inputs of the first, second and third windings 22, 25, and 27 are connected to the ground line 24 via a fourth, fifth and sixth diodes 32, 33, and 34, respectively. A capacitor 35 is connected between the ground line 24 and the input of the current sensor 5. In addition, test resistors 39 are also connected parallel to the fourth, fifth and sixth diodes 32, 33, 34. The control terminals of the transistors 19, 20, 21, 23, 26, 28 are connected to the control unit 11 via control lines. In a known manner, the control unit 11 controls the current supply to the windings 22, 25, 27, in order for a desired rpm and/or a desired torque to be output to the electromechanical brake 7 via the drive rod 6.

In the embodiment shown, the second current sensor 12 in the form of a resistor is disposed between the input of the first coil 22 and the input to the second coil 25. The terminals of the second current sensor 12 are in communication with the A/D converter 17 of the control unit 11, via measurement lines 36. Thus the second current sensor 12 is incorporated into an existing current circuit without additional switches. Because of the disposition of the second current sensor 12 between the high-side field effect transistors 19, 20 of the first and second windings 22, 25, respectively, the second current sensor 12 embodied as a resistor does not make itself annoyingly apparent in a normal motor commutation operation.

In a test of the current sensor 5, which is preferably performed when the motor is stopped, the first transistor 19 and the fifth transistor 26 are made conducting. The other transistors 20, 21, 23, 28 are blocked. In this state of the circuit, a test current flows to the ground line 24 via the current sensor 5, the first transistor 19, the second current sensor 12, the second winding 25, and the fifth transistor 26. The current flowing via the second current sensor 12 is calculated via the voltage drop detected across the second current sensor 12. The resistance of the second current sensor 12 is known, and the current can thus be calculated from the equation $$U = R \times I,$$

where U stands for the voltage drop across the second current sensor 12; R stands for the resistance of the second current sensor 12; and I stands for the current intensity.

Instead of the arrangement shown in FIG. 2, the second current sensor 12 can also be disposed between the input of the first and the input of the third winding 22, 27, or between the input of the second and the input of the third winding 25, 27. Depending on where the second current sensor 12 is disposed, suitable transistors should be made conducting in the monitoring process, so that a current flows across the second current sensor 12 and one winding.

In the test method, the current is detected both via the current sensor 5 and via the second current sensor 12. By way of a comparison of the two currents detected, a defect of the first and/or second current sensor 5,12 can be recognized.

The foregoing relates to preferred exemplary embodiments of the invention, it being understood that other variants and embodiments thereof are possible within the spirit and scope of the invention, the latter being defined by the appended claims.

What is claimed is:

1. A circuit arrangement comprising
a current circuit for supplying a current consumer (3),
a first current sensor (5) in the current circuit,
a control unit (11) connected to the first current sensor (5), the control unit (11), via the first current sensor (5), detecting a current flow to the consumer (3),
a second current sensor (12), the control unit (11) being connected to the second current sensor (12) that the control unit (11), via the second current sensor (12), detecting the current flow to the consumer (3) and monitoring the current circuit and the correct functioning of the first current sensor (5) by means of a comparison with the current detected by the first current sensor (5),
a first switch (9) connected to the control unit (11), the first switch (9) being operable to decouple the consumer (3) from the current flow, and
a further switch (13) connected to the control unit (11), the further switch (13) being operable to switch the second current sensor (12) into the current flow.

2. The circuit arrangement of claim 1, wherein the second current sensor (12) is embodied in the form of a resistor; wherein the voltage drop can be picked up via the resistor; and wherein the control unit (11) uses the voltage drop to monitor the current circuit.

3. The circuit arrangement of claim 1, wherein the consumer is a drive mechanism (3) for an electromechanical brake (7).

4. A method for monitoring a current supply to a consumer (3) that is supplied with current via an input line, and a first current sensor (5) is disposed in the input line, the method comprising providing a second current sensor (12) in the current flow, upstream or downstream of the consumer (3),
employing the first current sensor (5) and the second current sensor (12) to detect, a current, wherein the second current sensor (12) detects the current flow in the current circuit and monitors the correct functioning of the first current sensor (5); and comparing the detected currents with one another, and detecting an error function on the basis of the outcome of the comparison,
decoupling the consumer (3) from the current flow via a first switch (9), and switching the second current sensor (12) into the current flow via a further switch (13).

5. A circuit arrangement comprising
a current circuit for supplying a current consumer (3),
a first current sensor (5) in the current circuit,
a control unit (11) connected to the first current sensor (5), the control unit (11), via the first current sensor (5), detecting a current flow to the consumer (3),
a second current sensor (12), the control unit (11) being connected to the second current sensor (12) that the control unit (11), via the second current sensor (12), detecting the current flow to the consumer (3) and monitoring the current circuit and the correct functioning of the first current sensor (5) by means of a comparison with the current detected by the first current sensor (5),
wherein the consumer is a winding (4, 22, 25, 27) of an electric drive mechanism (3),
wherein the electric drive mechanism (3) has at least two windings (22, 25, 27); wherein each winding (22, 25, 27) is connected to an input switch (19, 20, 21) via an input line; wherein the input switches (19, 20, 21) are connected to a positive potential; wherein each winding can be connected to a negative potential via a respective switch (23, 26, 28); and wherein the second current sensor (12) is connected between two input lines.

6. The circuit arrangement of claim 5, wherein the second current sensor (12) is embodied as a resistor; and wherein at least one input line is connected to a voltage meter unit (17).

7. The circuit arrangement of claim 6, wherein the second current sensor (12) can be connected in series with a winding (25); and wherein from the voltage drop via the second current sensor (12), a current flowing in the current circuit can be ascertained.

8. The circuit arrangement of claim 5, wherein the second current sensor (12) can be connected in series with a winding (25); and wherein from the voltage drop via the second current sensor (12), a current flowing in the current circuit can be ascertained.

* * * * *